United States Patent
Ivanov et al.

(10) Patent No.: US 7,382,030 B1
(45) Date of Patent: Jun. 3, 2008

(54) INTEGRATED METAL SHIELD FOR A FIELD EFFECT TRANSISTOR

(75) Inventors: Tony Ivanov, Summerfield, NC (US); Michael Carroll, Jamestown, NC (US); Triet Dinh, High Point, NC (US); Julio Costa, Summerfield, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 21 days.

(21) Appl. No.: 11/459,829

(22) Filed: Jul. 25, 2006

(51) Int. Cl.
*H01L 29/78* (2006.01)

(52) U.S. Cl. ...................................... 257/409; 257/340

(58) Field of Classification Search ........ 257/E21.435, 257/288, 409, 340
See application file for complete search history.

(56) References Cited

U.S. PATENT DOCUMENTS

| | | | |
|---|---|---|---|
| 6,614,088 B1 | 9/2003 | Beasom | |
| 6,653,691 B2 | 11/2003 | Baliga | |
| 6,664,593 B2 | 12/2003 | Peake | |
| 6,677,210 B1 | 1/2004 | Hebert | |
| 6,707,102 B2 | 3/2004 | Morikawa et al. | |
| 6,740,952 B2 | 5/2004 | Fujishima et al. | |
| 6,838,731 B1 | 1/2005 | D'Anna et al. | |
| 6,998,679 B2 | 2/2006 | Inoue et al. | |
| 7,061,057 B2 | 6/2006 | Babcock et al. | |
| 7,109,562 B2 | 9/2006 | Lee | |
| 2006/0175670 A1* | 8/2006 | Tsubaki | 257/409 |

* cited by examiner

*Primary Examiner*—Douglas M. Menz
(74) *Attorney, Agent, or Firm*—Withrow & Terranova, PLLC

(57) ABSTRACT

The present invention relates to a semiconductor device having an integrated metal shield. The shield, created as part of a MOSFET, is formed about a gate electrode of the MOSFET to effectively reduce drain-to-gate capacitance and increase breakdown voltage. The shield consists of a metallic shield contact via and a source contact extension. The metallic shield contact via, formed between the gate electrode and a drain region of the MOSFET, may be either a series of closely spaced vias or a wide continuous via. The metallic shield contact via is isolated from the surface of a semiconductor wafer by a shield isolation layer at one end. The metallic shield contact via is electrically coupled to the source contact extension at the other end. The source contact extension is metallic, and may be formed from the same metal used to create a source contact and a drain contact for the MOSFET.

24 Claims, 8 Drawing Sheets

INTEGRATED METAL SHIELD FOR A FIELD EFFECT TRANSISTOR

FIELD OF THE INVENTION

The present invention relates to semiconductor devices, and more particularly to manufacturing a semiconductor device having an integrated metal shield.

BACKGROUND OF THE INVENTION

With reference to FIG. 1, a typical metal oxide semiconductor field effect transistor (MOSFET) 10 is illustrated. The MOSFET 10 is formed by creating a source region 12 and a drain region 14 in a semiconductor wafer 16 and placing a gate electrode 18 over the surface of the semiconductor wafer 16 between the source region 12 and the drain region 14. The source region 12 and the drain region 14 are heavily doped with N-type material. The gate electrode 18 is isolated from the surface of the semiconductor wafer 16 by an appropriate gate dielectric layer 20. In the illustrated embodiment, a lightly doped drain region 22 in the semiconductor wafer 16 extends from the drain region 14 to the gate electrode 18. Also, a body region 24 may be formed in the semiconductor wafer 16 adjacent to the source region 12 wherein the source region 12 is between the body region 24 and the gate electrode 18.

Electrical contacts to the body region 24, source region 12, and drain region 14 may be established through conductive vias. As illustrated, a body contact via 26 and a source contact via 28 extend from the respective body region 24 and source region 12 to a source contact 30. A drain contact via 32 extends from the drain region 14 to a drain contact 34. The electrical contact to the gate electrode 18 is not shown.

MOSFETs 10 are used in numerous electrical applications, including those that are required to operate at high frequencies and over wide operating voltage ranges. Designers are constantly faced with the challenge of creating MOSFETs 10 that operate at higher frequencies and higher operating voltage ranges. The inherent drain-to-gate capacitance of the MOSFET 10 is a significant obstacle in achieving higher operating frequencies. The breakdown voltage of the MOSFET 10 is a significant obstacle in achieving wider operating voltage ranges.

Reference is now made to FIG. 2. In an effort to reduce drain-to-gate capacitance and increase breakdown voltage, a shield 36 was formed over the gate electrode 18 and lightly doped drain region 22. The shield 36 effectively reduces drain-to-gate capacitance. FIGS. 1 and 2 provide electrostatic potential contour lines throughout the semiconductor wafer 16 at the breakdown voltage of the respective MOSFET 10. As illustrated, the breakdown voltage is significantly increased when the shield 36 is employed.

The shield 36 is isolated from the gate electrode 18 and the surface of the semiconductor wafer 16 by extending a gate electrode spacer 38 from the gate electrode 18 toward the drain region 14. Notably, the shield 36 is formed by depositing an additional polysilicon layer over the extended gate electrode spacer 38. Unfortunately, formation of the additional polysilicon layer requires an additional polysilicon process step, which is not part of a common MOSFET manufacturing process. Further, the widely varying topology of the MOSFET 10 makes the etching process for creating the shield 36 from the additional polysilicon layer complex.

Accordingly, there is a need to create a shield that reduces drain-to-gate capacitance and increases breakdown voltage of a MOSFET 10 in a more efficient and effective manner. In particular, there is a need to create a shield that does not require adding an additional polysilicon layer to the normal manufacturing process or require etching over a complex topology.

SUMMARY OF THE INVENTION

The present invention relates to a semiconductor device having an integrated metal shield. The shield is created as part of a MOSFET and is formed about a gate electrode of the MOSFET to effectively reduce drain-to-gate capacitance and increase breakdown voltage. The shield consists of a metallic shield contact via and a source contact extension. The metallic shield contact via is formed between the gate electrode and a drain region of the MOSFET. This metallic shield contact via, which may be either a series of closely spaced vias or a wide continuous via, is isolated from the surface of a semiconductor wafer by a shield isolation layer at one end. The metallic shield contact via is electrically coupled to the source contact extension at the other end. The source contact extension is metallic, and may be formed from the same metal used to create a source contact and a drain contact for the MOSFET.

To manufacture the MOSFET with an integrated metal shield, the semiconductor wafer is formed having a source and drain region. The gate electrode surrounded by a gate electrode spacer is positioned on the surface of the semiconductor wafer between the source region and the drain region. The shield isolation layer, which may be an extension of the existing gate electrode spacer or a dielectric layer over the gate electrode spacer, is then positioned over the surface of the semiconductor wafer between the gate electrode and the drain region. Next, metallic vias are formed in a dielectric layer, which is created over the semiconductor wafer. Source contact vias and drain contact vias are electrically coupled to the source region, and the drain region, respectively, through a contact layer. The metallic shield contact via is formed and connected to the shield isolation layer between the gate electrode and the drain region. Finally, a metal layer is formed over the dielectric layer and the metallic vias so that the source contact, source contact extension, and drain contact are formed. The source contact is electrically coupled to the source contact via, and isolated from the drain contact. The source contact extension is electrically coupled to the shield contact via and may be electrically coupled to the source contact, remaining isolated from the drain contact. Forming this integrated metal shield does not necessarily require a polysilicon layer in addition to those normally required to manufacture the MOSFET or etching over a complex topology.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 3A:
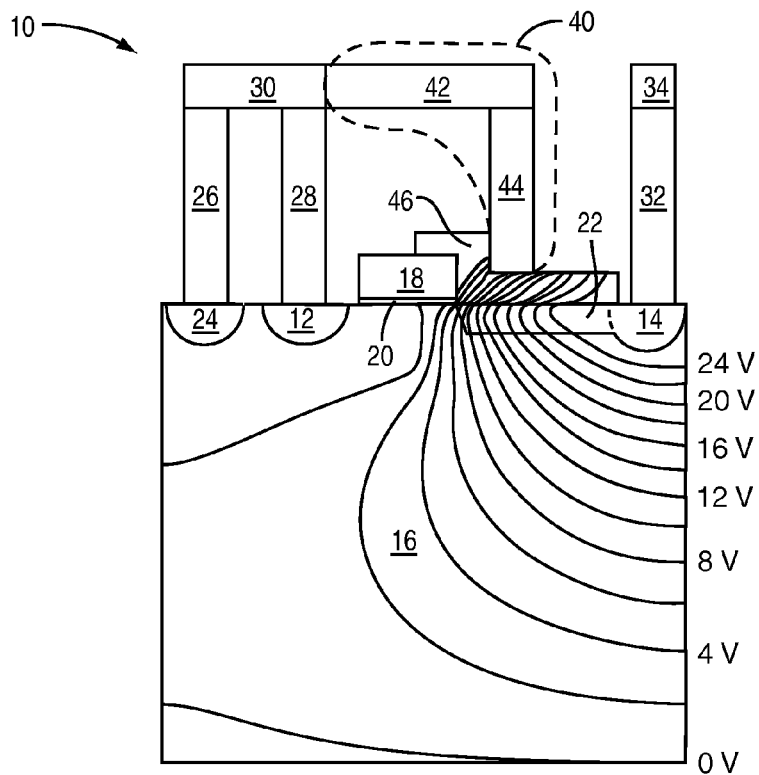
FIG. 3A depicts a MOSFET having an integrated metal shield and corresponding electrical potential lines according to one embodiment of the present invention.

A graphical representation of a MOSFET 10 according to the present invention is depicted in FIG. 3A. The MOSFET 10 includes a unique metal shield 40, which is formed from a metallic shield extension 42 and metallic shield vias 44. The shield 40 functions to reduce drain-to-gate capacitance and increase breakdown voltage over MOSFETs 10 that do not employ shielding. Further, manufacturing a MOSFET 10 with the metal shield 40 does not require a polysilicon layer in addition to those normally required to manufacture the MOSFET 10 or etching over a complex topology.

In traditional fashion, the MOSFET 10 is formed by creating a source region 12 and a drain region 14 in a semiconductor wafer 16 and placing a gate electrode 18 over the surface of the semiconductor wafer 16 between the source region 12 and the drain region 14. The source region 12 and the drain region 14 are heavily doped with N-type material. The gate electrode 18 is isolated from the surface of the semiconductor wafer 16 by an appropriate gate dielectric layer 20. In the illustrated embodiment, a lightly doped drain region 22 in the semiconductor wafer 16 extends from the drain region 14 to the gate electrode 18. Also, a body region 24 may be formed in the semiconductor wafer 16 adjacent to the source region 12 wherein the source region 12 is between the body region 24 and the gate electrode 18.

Electrical contacts to the body region 24, source region 12, and drain region 14 may be established through conductive vias. As illustrated, a body contact via 26 and a source contact via 28 extend from the respective body region 24 and source region 12 to a source contact 30. A drain contact via 32 extends from a drain region 14 to a drain contact 34. The electrical contact to the gate electrode 18 is not shown.

A shield isolation layer 46, formed on the surface of the semiconductor wafer 16, partially covers the gate electrode 18 and extends to the drain region 14. Notably, the shield isolation layer 46 may be the gate electrode spacer 38 or other dielectric layer. The shield isolation layer 46 provides an etch stop for the shield vias 44 and isolates the shield vias 44 from the surface of the semiconductor wafer 16.

Figure 3B:
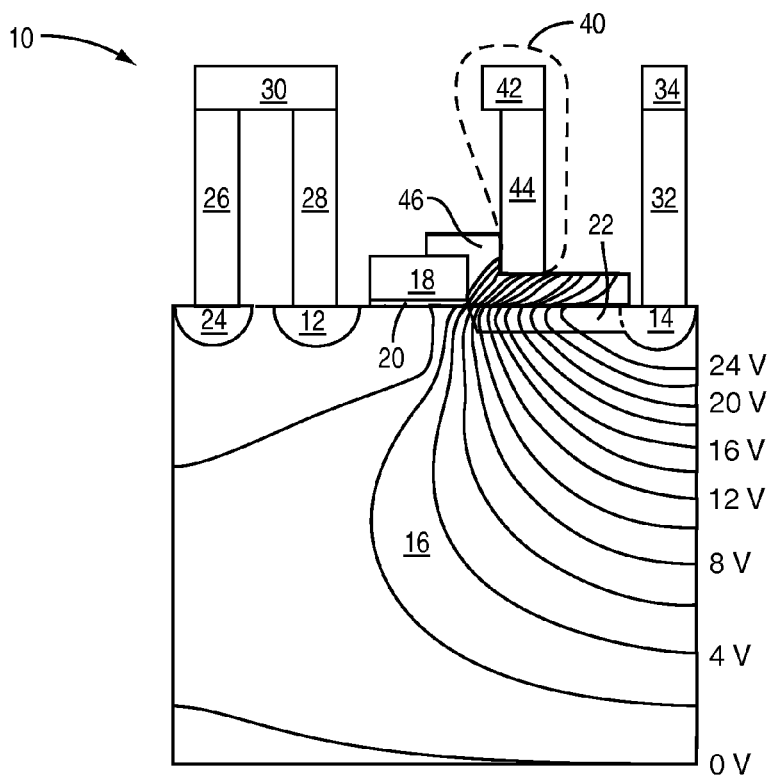
FIG. 3B depicts the MOSFET shown in FIG. 3 with the source contact extension isolated from the source contact.

For the present invention, the shield 40 is formed from the shield vias 44 and the source contact extension 42. The shield vias 44 extend from the shield isolation layer 46 to the source contact extension 42, which is preferably created from the same metal layer that is used to create the source contact 30 and drain contact 34. As illustrated, the source contact extension 42 connects to, or effectively extends from, the source contact 30. However, the source extension 42 may be isolated from the source contact 30, as shown in FIG. 3B, and coupled to a voltage control node (not shown).

Figure 1:
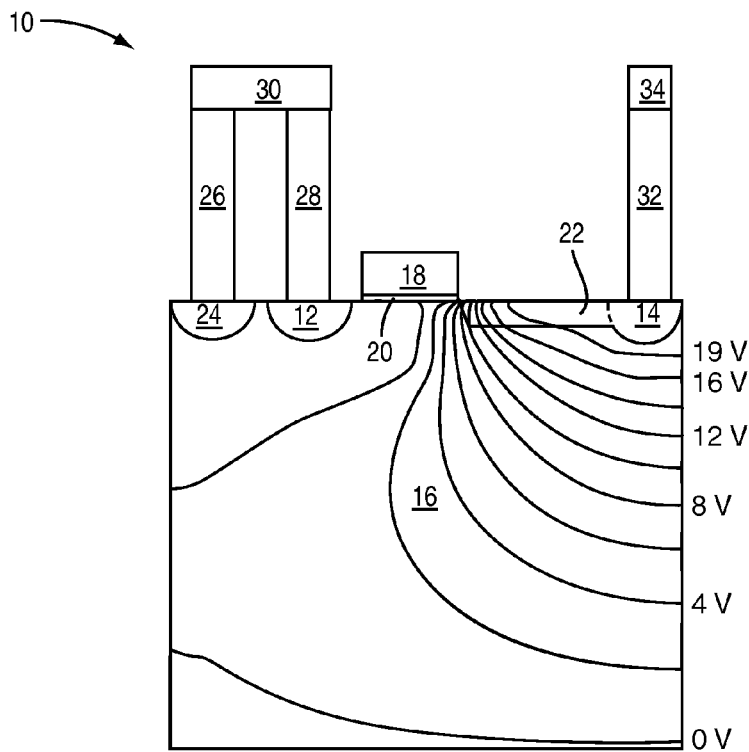
FIG. 1 depicts a traditional metal oxide field effect transistor (MOSFET) with corresponding electrostatic potential lines.
Figure 2:
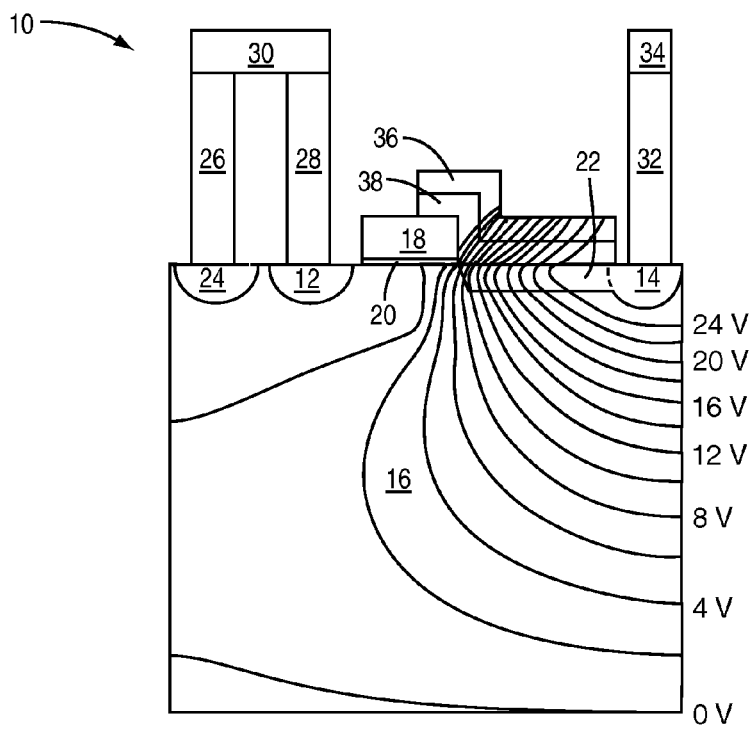
FIG. 2 depicts the MOSFET of FIG. 1 with corresponding electrostatic potential lines.

When comparing the electrostatic potential contour lines throughout the semiconductor wafer 16 at the breakdown voltage of the respective MOSFETs 10 of FIGS. 1 and 3A, the shield 40 of the present invention functions to significantly increase breakdown voltage over MOSFETs 10 that do not employ shielding. Manufacturing a MOSFET 10 with the metal shield 40 does not require a polysilicon layer in addition to those normally required to manufacture the MOSFET 10 or etching over a complex topology. The shield 40 also significantly reduces drain-to-gate capacitance. As such, the MOSFET 10 of the present invention provides the benefits of the MOSFET 10 shown in FIG. 2 while not overly complicating the manufacturing process.

Figure 4:
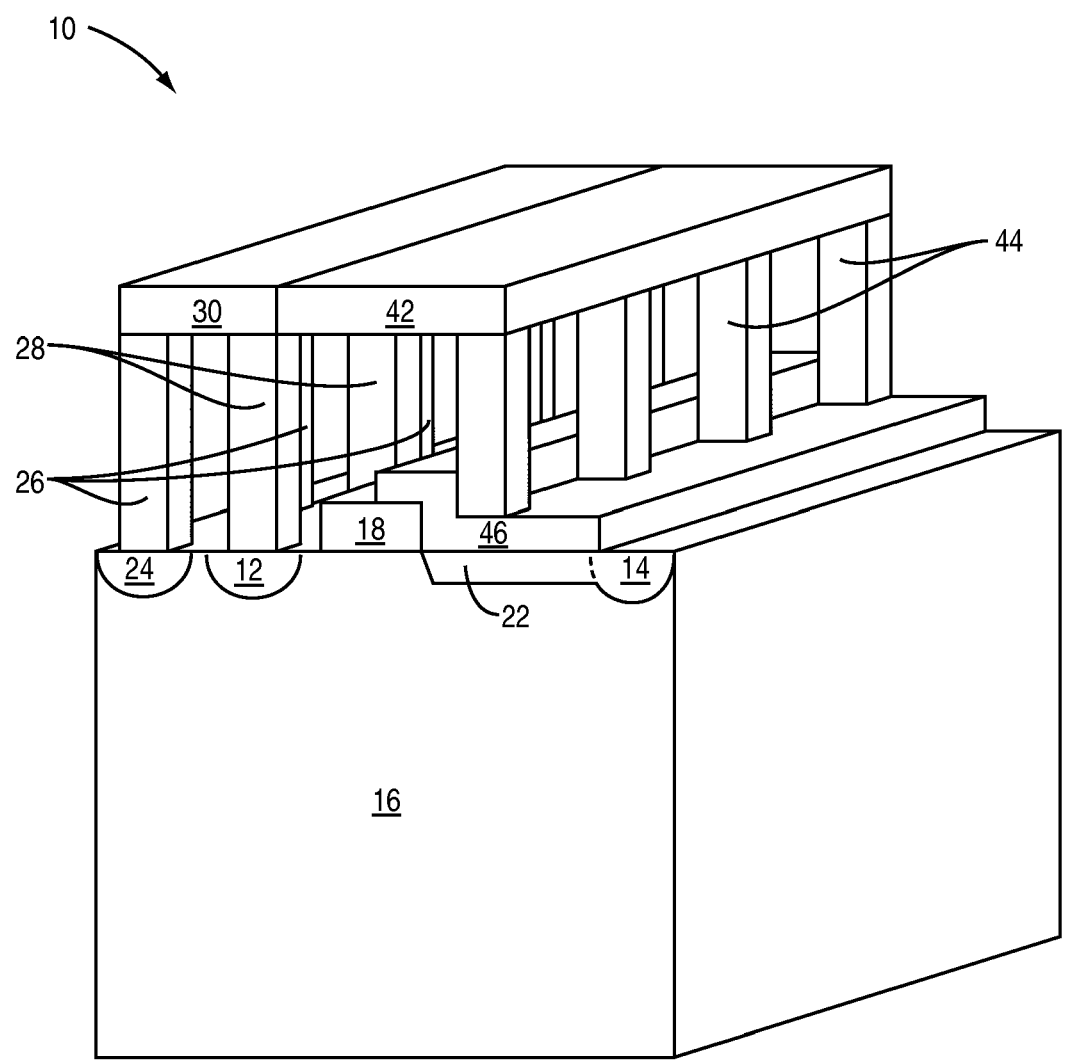
FIG. 4 depicts a perspective representation of a MOSFET having an integrated metal shield according to one embodiment of the present invention.

A perspective representation of the MOSFET 10 without illustrating the drain contact via 32 and drain contact 34 is depicted in FIG. 4. This representation shows that a series of shield contact vias 44 may be used to form the shield 40. The shield contact via 44 may also be a continuous via that appears as a planar vertical connector.

Figure 5:
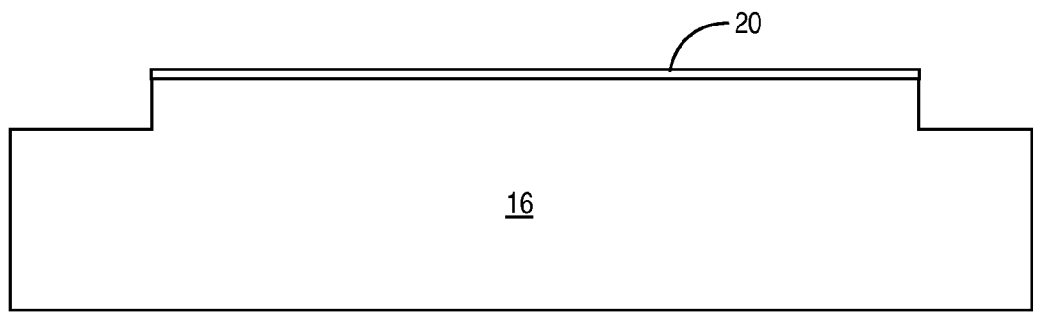
FIGS. 5-18 depict the stepwise process of manufacturing the MOSFET having an integrated metal shield according to one embodiment of the present invention.
Figure 6:
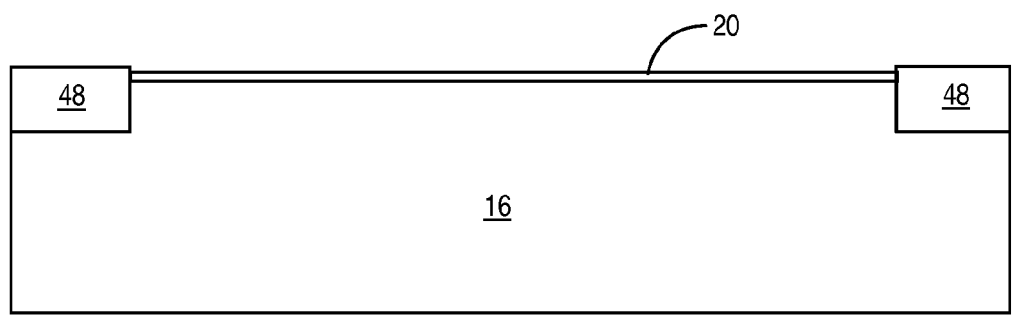

With reference to the graphical representations of FIGS. 5-18, a manufacturing process for the MOSFET 10 having a shield 40 is provided for this embodiment of the present invention. In this example, a dual MOSFET 10 with a common drain region 14 is shown. In FIG. 5, the manufacturing process begins by forming a gate dielectric layer 20 on top of the semiconductor wafer 16. This gate dielectric layer 20 may be an oxide, nitride, or any other appropriate dielectric, and may be formed on the semiconductor wafer 16 by known methods. Next, the semiconductor wafer 16 is processed using known lithography or etching techniques to remove undesirable portions of the gate dielectric layer 20. Then, trenches are etched on both sides of the active device area to provide an area for field isolation regions 48. In FIG. 6, the field isolation regions 48, which may be made of silicon oxide, are created in order to provide a separation between the active device areas. In an exemplary embodiment, these field isolation regions 48 are shallow trench isolation (STI) trenches.

Figure 7:
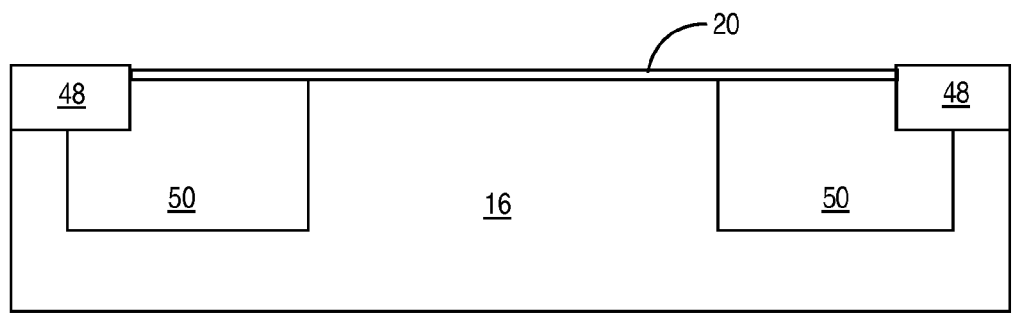
Figure 8:
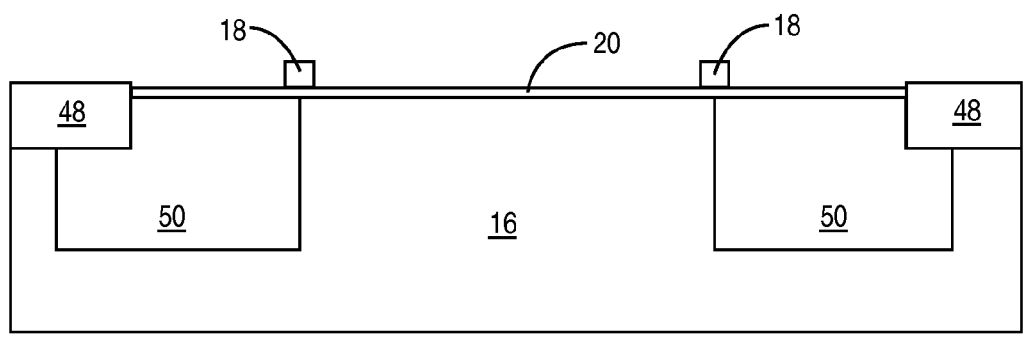

In FIG. 7, substrate doping implant regions 50, which are commonly referred to as P wells, are formed in the semiconductor wafer 12. The substrate doping implant regions 50 provide areas to create the source regions 12, body regions 24. In FIG. 8, through the process of gate oxidation, poly deposition, photolithography, and etching, the gate electrodes 18 are formed on top of the gate dielectric layer 20.

Figure 9:
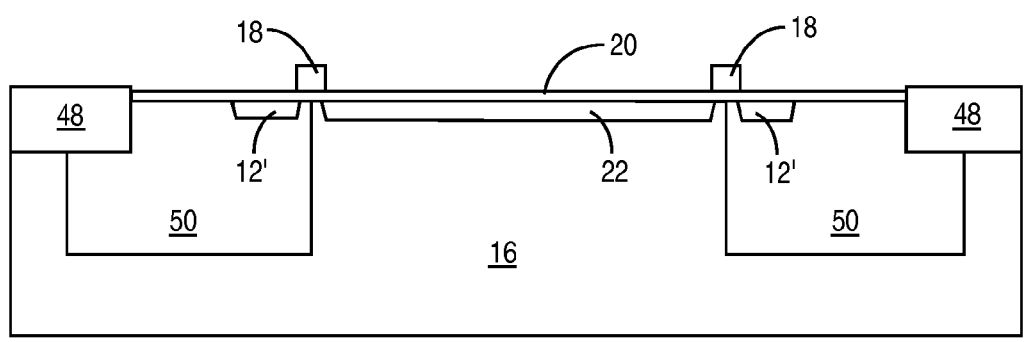
Figure 10:
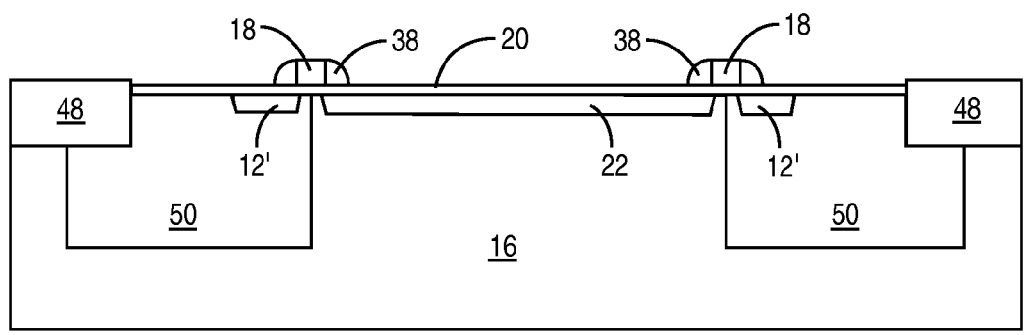

In FIG. 9, a lightly doped (N⁻) drain region 22, comprised of N type material is formed in the semiconductor wafer 16. The lightly doped drain region 22 extends from the gate electrode 18 to the drain region 14. The doping process (not labeled) may also lightly dope all or a part of an area 12', which will be heavily doped in a subsequent step to form the source regions 12. In FIG. 10, the gate electrode spacer 38 is formed about the gate electrode.

Figure 11:
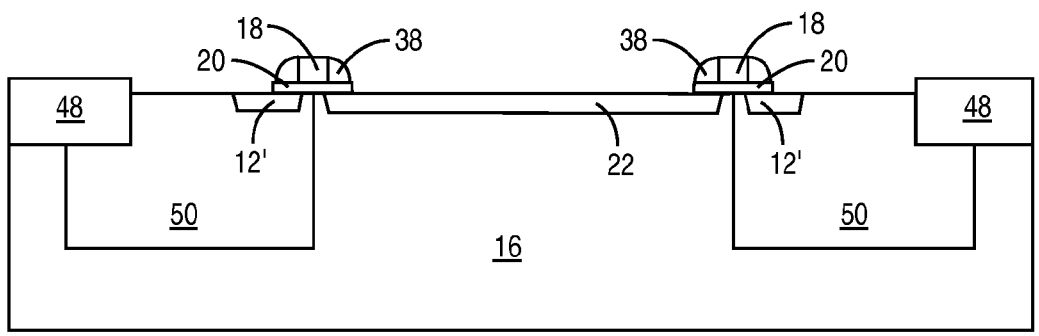

In FIG. 11, the gate dielectric layer 20 is then removed from the top of the semiconductor wafer 16. A portion of the gate dielectric layer 20 will remain between the semiconductor wafer 16 and the gate electrode 18. It should be noted that the gate dielectric layer 20 may also remain between the gate electrode spacer 38 and the semiconductor wafer 16.

Figure 12:
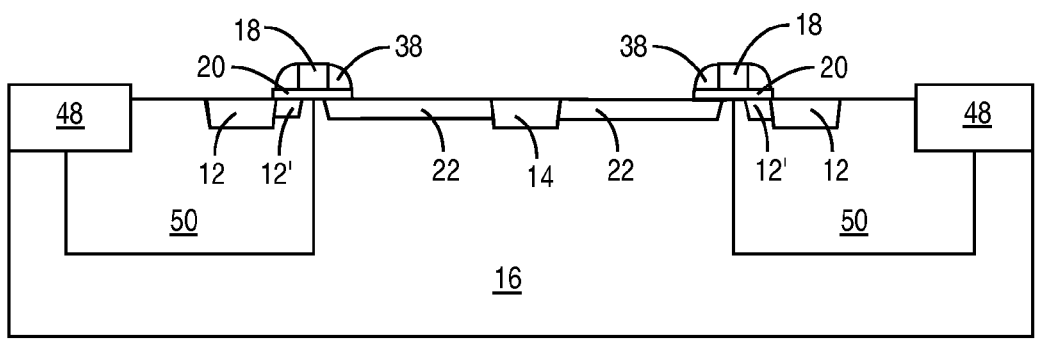
Figure 13:
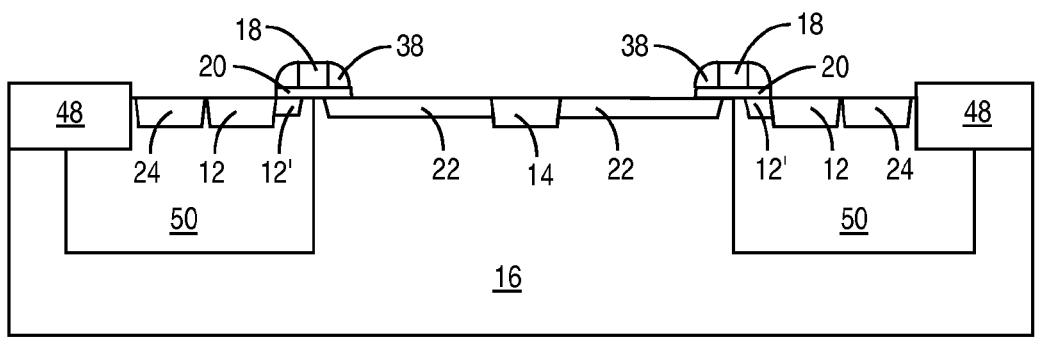

In FIG. 12, the source region 12 is created by implanting N-type material into the respective substrate doping implant regions 50. The drain region is created by implanting N-type material into the lightly doped drain region 22. The source region 12 and the drain region 14 are heavily doped (N+) with N-type material. The source region 12 and the drain region 14 may undergo rapid thermal annealing in order to be activated. In FIG. 13, the body region 24 is created by implanting P type material into the respective substrate doping implant region 50 to form the body region 24 adjacent to the source. The body region 24 is heavily doped (P+) with P-type material.

Figure 14:
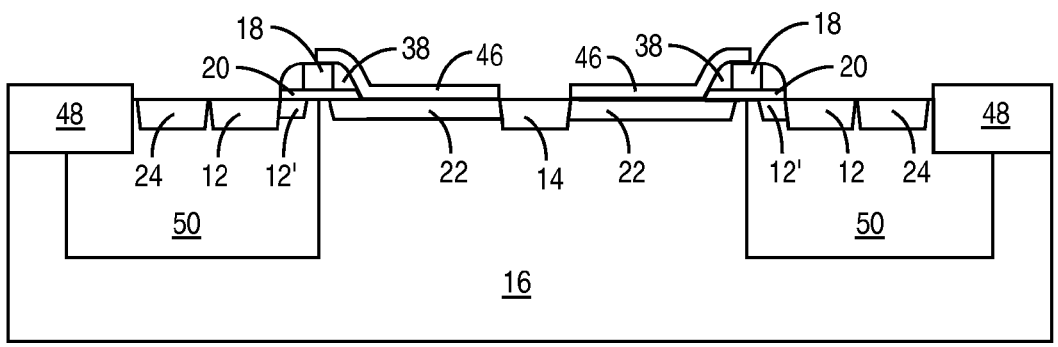

In FIG. 14, a shield isolation layer 46 is then created on the semiconductor wafer 16 between the gate electrode 18 and the drain region 14. The shield isolation layer 46 is positioned over the lightly doped drain region 22 and extends to and covers at least a portion of the gate electrode 18. The shield isolation layer 46 functions as an etch stop during subsequent creation of the shield contact vias 44 formed as part of the manufacturing process and as an insulator to isolate the semiconductor wafer 16 and the shield contact vias 44. Instead of creating a separate shield isolation layer 46, the shield isolation layer 46 may be the gate electrode spacer 38, or other dielectric layer.

Figure 15:
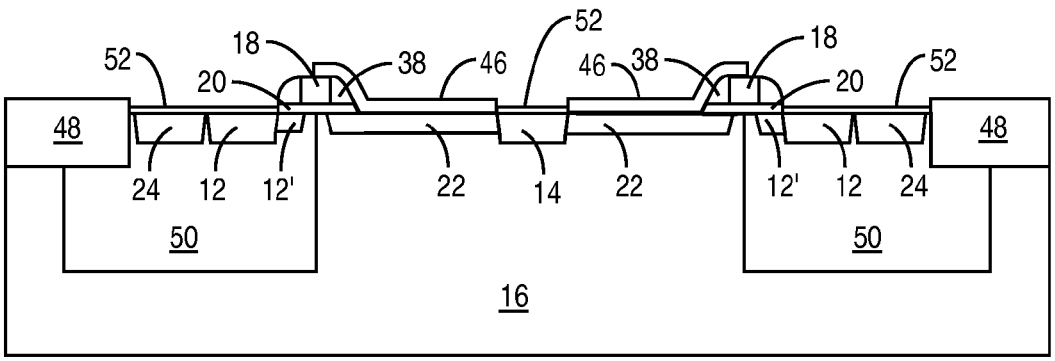

In FIG. 15, a contact layer 52 is deposited on the surface of the semiconductor wafer 16 and over the body region 24, source region 12, and the drain region 14. This contact layer 52 may be a salicide layer. The contact layer 52 facilitates electrical contact between the body contact via 26, source contact via 28, and drain contact via 32, and the body region 24, the source region 12, and the drain region 14, respectively, while lowering the contact resistance to the semiconductor wafer 16.

Figure 16:
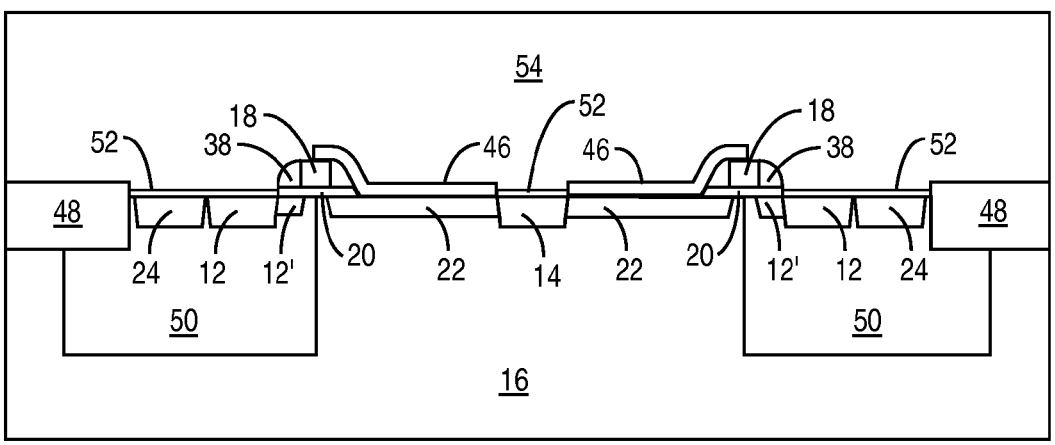
Figure 17:
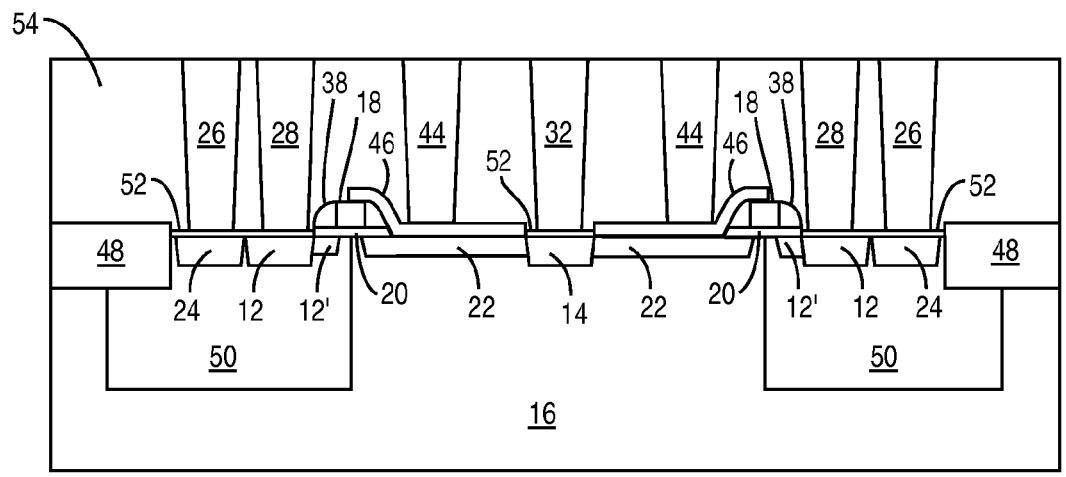

In FIG. 16, a dielectric layer 54, which may be oxide, nitride, or any other appropriate dielectric, is formed over all or most of the semiconductor wafer 16. Holes, slots, grooves, or the like, are then etched through the dielectric layer 54 and filled or lined with metal to form the body contact via 26, the source contact via 28, the drain contact via 32 and the shield contact via 44 as shown in FIG. 17. Body contact vias 26 will be electrically coupled to the contact layer 52 above the body region 24 in order to provide a conductive path. Source contact vias 28 will be electrically coupled to the contact layer 54 above the source region 12. A drain contact via 32 will be electrically coupled with the contact layer 54 above the drain region 14 that is adjacent to the lightly doped drain region 22 in order to provide a conductive path. Next, the shield contact vias 44 are formed in contact with the shield isolation layer 46 and are located between the gate electrode 18 and the drain region 14. In one embodiment, the shield contact vias 44 are substantially adjacent to the gate electrode 18, but not in contact with the gate electrode 18. As noted, the shield contact vias 44 may be a continuous via (connector) or a series of closely spaced vias.

Figure 18:
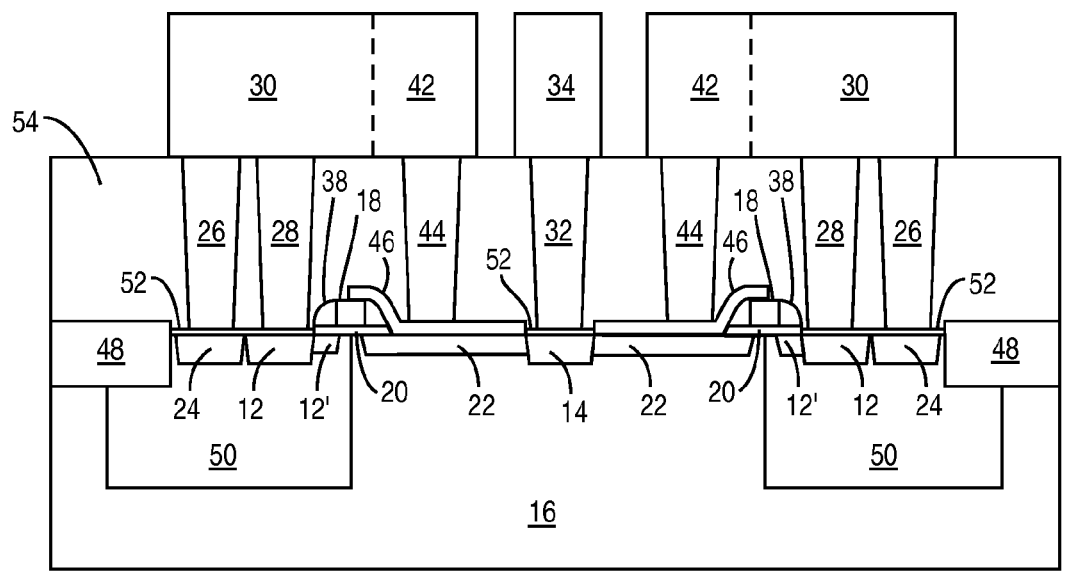

Next, a metal layer is formed over the dielectric layer 54 and the body contact via 26, source contact via 28, drain contact via 32 and shield contact via 44. The metal may be Al, Cu, or any other appropriate conducting material. By etching the metal layer, a source contact 30, source contact extension 42, and a drain contact 34 are formed as shown in FIG. 18. The source contact 30 may be electrically coupled to the body contact via 26 and the source contact via 28, but isolated from the drain contact 34. The source contact extension 42 is electrically coupled to the shield via 44 and may be electrically coupled to the source contact 30. In an alternative embodiment, the source contact extension 42 may be isolated from the source contact 30 and drain contact 34, but connected to a control node (not shown) to allow control of the electrical potential of the shield 40 during operation. The drain contact 34 is electrically coupled to the drain contact via 32 and isolated from the source contact 30 and the source contact extension 42. The source contact extension 42 and shield contact via 44 form the shield 40 about the gate electrode 18.

Those skilled in the art will recognize improvements and modifications to the preferred embodiments of the present invention. All such improvements and modifications are considered within the scope of the concepts disclosed herein and the claims that follow.

What is claimed is:

1. A semiconductor comprising:
   a wafer comprising a source region and a drain region;
   a gate electrode formed over a surface of the wafer and between the source region and the drain region, wherein the gate electrode is electrically isolated from the surface of the wafer;
   a shield isolation layer over at least a portion of the surface of the wafer between the gate electrode and the drain region, wherein the shield isolation layer comprises a dielectric;
   a metallic source contact via comprising a first top end and a first bottom end, which is electrically coupled to and extends from the source region;
   a metallic shield contact via comprising a second top end and a second bottom end, which is in contact with and extends from the shield isolation layer, wherein the metallic shield contact via is between the gate electrode and the drain region;
   a source contact electrically coupled to the first top end of the metallic source contact via; and
   a source contact extension electrically coupled to the second top end of the metallic shield contact via, wherein the source contact extension and the metallic shield contact via form a metal shield about the gate electrode.

2. The semiconductor of claim 1 wherein the source contact and the source contact extension are formed from a common metallic layer.

3. The semiconductor of claim 1 wherein the source contact extension is electrically coupled to the source contact.

4. The semiconductor of claim 1 comprising a body region and a metallic body contact via, wherein the metallic body contact via has a third bottom end electrically coupled to and extending from the body region, and a third top end electrically coupled to the source contact.

5. The semiconductor of claim 4 wherein the metallic body contact via is electrically coupled to and extends from the body region through a salicide layer.

6. The semiconductor of claim 1 further comprising a metallic drain contact via comprising a fourth top end electrically coupled to the drain contact, and a fourth bottom end electrically coupled to and extending from the drain region.

7. The semiconductor of claim 6 wherein the source contact, source contact extension, and drain contact via are formed from a common metallic layer.

8. The semiconductor of claim 1 wherein the metallic shield contact via is positioned substantially adjacent to the gate electrode and electrically isolated from the gate electrode.

9. The semiconductor of claim 1 wherein the shield isolation layer extends to and covers at least a portion of the gate electrode.

10. The semiconductor of claim 9 wherein the shield isolation layer is one of the group consisting of a gate electrode spacer and a dielectric layer over the gate electrode spacer.

11. The semiconductor of claim 1 wherein the metallic shield contact via is isolated from the surface of the wafer and the gate electrode.

12. The semiconductor of claim 1 wherein a lightly doped drain region is formed within the wafer between the gate electrode and the drain region and underneath at least a portion of the shield isolation layer.

13. A method of manufacturing a semiconductor comprising:
   providing a wafer comprising a source region and a drain region;
   forming a gate electrode over a surface of the wafer and between the source region and the drain region, wherein the gate electrode is electrically isolated from the surface of the wafer;
   forming a shield isolation layer over at least a portion of the surface of the wafer between the gate electrode and the drain region, wherein the shield isolation layer comprises a dielectric;
   forming a metallic source contact via comprising a first top end and a first bottom end, which is electrically coupled to and extends from the source region;
   forming a metallic shield contact via comprising a second top end and a second bottom end, which is in contact with and extends from the shield isolation layer, wherein the metallic shield contact via is between the gate electrode and the drain region;
   forming a source contact electrically coupled to the first top end of the metallic source contact via; and
   forming a source contact extension electrically coupled to the second top end of the metallic shield contact via, wherein the source contact extension and the metallic shield contact via form a metal shield about the gate electrode.

14. The method of claim 13 wherein the source contact and the source contact extension are formed from a common metallic layer.

15. The method of claim 13 wherein the source contact extension is electrically coupled to the source contact.

16. The method of claim 13 comprising a body region and a metallic body contact via, wherein the metallic body contact via has a third bottom end electrically coupled to and extending from the body region, and a third top end electrically coupled to the source contact.

17. The method of claim 16 wherein the metallic body contact via is electrically coupled to and extends from the body region through a salicide layer.

18. The method of claim 13 further comprising a metallic drain contact via comprising a fourth top end electrically coupled to the drain contact and a fourth bottom end electrically coupled to and extending from the drain region.

19. The method of claim 18 wherein the source contact, source contact extension, and drain contact via are formed from a common metallic layer.

20. The method of claim 13 wherein the metallic shield contact via is positioned substantially adjacent to the gate electrode and electrically isolated from the gate electrode.

21. The method of claim 13 wherein the shield isolation layer extends to and covers at least a portion of the gate electrode.

22. The method of claim 21 wherein the shield isolation layer is one of the group consisting of a gate electrode spacer and a dielectric layer over the gate electrode spacer.

23. The method of claim 13 wherein the metallic shield contact via is isolated from the surface of the wafer and the gate electrode.

24. The method of claim 13 wherein a lightly doped drain region is formed within the wafer between the gate electrode and the drain region and underneath at least a portion of the shield isolation layer.

* * * * *